(12) United States Patent
Hu et al.

(10) Patent No.: US 7,486,709 B2
(45) Date of Patent: Feb. 3, 2009

(54) SEMICONDUCTOR LASER MICRO-HEATING ELEMENT STRUCTURE

(75) Inventors: Martin Hai Hu, Painted Post, NY (US);
Xingsheng Liu, Santa Clara, CA (US);
Chung-En Zah, Holmdel, NJ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/542,408

(22) Filed: Oct. 3, 2006

(65) Prior Publication Data

US 2008/0025355 A1 Jan. 31, 2008

Related U.S. Application Data

(60) Provisional application No. 60/833,531, filed on Jul. 26, 2006.

(51) Int. Cl.
*H01S 3/04* (2006.01)
(52) U.S. Cl. ............................. 372/34; 372/20; 372/23; 372/43.01
(58) Field of Classification Search .................. 372/20, 372/23, 34, 43.01, 46.01, 50.11, 50.123, 372/102
See application file for complete search history.

(56) References Cited

U.S. PATENT DOCUMENTS

| | | | | |
|---|---|---|---|---|
| 5,084,894 A | * | 1/1992 | Yamamoto | ................ 372/50.22 |
| 5,173,909 A | | 12/1992 | Sakano et al. | ................. 372/20 |
| 5,341,391 A | * | 8/1994 | Ishimura | ................... 372/46.01 |
| 5,345,459 A | | 9/1994 | Richardson et al. | ........... 372/34 |
| 5,536,085 A | * | 7/1996 | Li et al. | ..................... 372/50.12 |
| 6,037,574 A | * | 3/2000 | Lanham et al. | .............. 219/544 |
| 6,700,910 B1 | | 3/2004 | Aoki et al. | ..................... 372/43 |
| 6,782,164 B1 | | 8/2004 | Lee et al. | ....................... 385/37 |
| 7,289,545 B2 | | 10/2007 | Charles | ........................ 372/34 |
| 2002/0080838 A1 | * | 6/2002 | Orita et al. | ..................... 372/46 |
| 2005/0254531 A1 | | 11/2005 | Furukawa et al. | ............. 372/22 |

FOREIGN PATENT DOCUMENTS

GB 2408847 6/2005

OTHER PUBLICATIONS

M. Aoki et al, "Low-Power-Consumption Thin-Film Heater-Loaded Wavelength-Tunable DFB Laser", Fifth Asia-Pacific Conference on Communications and Fourth Optoelectronics and Communications Conference, APCC/OECC '99. vol. 2, pp. 1548-1549, Oct. 18-22, 1999.

(Continued)

*Primary Examiner*—Minsun Harvey
*Assistant Examiner*—Kinam Park
(74) *Attorney, Agent, or Firm*—Kwadjo Adusei-Poku; Dinsmore & Shohl, LLP (57) ABSTRACT

A semiconductor laser is provided comprising a semiconductor substrate, an active region, a ridge waveguide, a driving electrode structure, and a micro-heating element structure. The micro-heating element structure comprises a pair of heating element strips extending along the longitudinal dimension of the semiconductor laser. The heating element strips are on opposite sides of the ridge waveguide such that one of the heating element strips extends along one side of the ridge waveguide while a remaining heating element strip extends along another side of the ridge waveguide.

18 Claims, 5 Drawing Sheets

OTHER PUBLICATIONS

N. P. Caponio et al, "Analysis and Design Criteria of Three-Section DBR Tunable Lasers," IEEE J. Selected Areas in Communication, vol. 8, No. 6, pp. 1203-1213, Aug. 1990.

T. Kameda et al, "A DBR Laser Employing Passive-Section Heaters, with 10.8 nm Tuning Range and 1.6 MHz Linewidth," IEEE Photonics Technology Letters, vol. 5, No. 6, pp. 608-610, Jun. 1993.

H. Mori et al, "Broad Range Continuous Wavelength Tuning Characteristics of DBR Lasers Employing Passive-Section Heaters," 8th Annual Meeting Conference Proceedings of IEEE Lasers and Electro-Optics Society Annual Meeting, vol. 1, pp. 262-263, 1995.

S. Sakano et al, "Tunable DFB Laser with a Striped Thin-Film Heater", IEEE Photonics Technology Letters, vol. 4, No. 4, Apr. 1992, pp. 321-323.

* cited by examiner

SEMICONDUCTOR LASER MICRO-HEATING ELEMENT STRUCTURE

CROSS-REFERENCE TO RELATED APPLICATIONS

This application claims the benefit of priority under 35 U.S.C. § 119(e) of U.S. Provisional Application Ser. No. 60/833,531 filed on Jul. 26, 2006, the content of which is relied upon and incorporated herein by reference in its entirety.

BACKGROUND OF THE INVENTION

The present invention relates generally to semiconductor lasers and, more particularly to the control of temperature in specific regions of a semiconductor laser.

SUMMARY OF THE INVENTION

The present invention relates generally to semiconductor lasers, which may be configured in a variety of ways. For example, and by way of illustration, not limitation, short wavelength sources can be configured for high-speed modulation by combining a single-wavelength semiconductor laser, such as a distributed-feedback (DFB) laser or a distributed-Bragg-reflector (DBR) laser, with a light wavelength conversion device, such as a second-harmonic-generation (SHG) crystal. The SHG crystal can be configured to generate higher harmonic waves of the fundamental laser signal by tuning, for example, a 1060 nm DBR or DFB laser to the spectral center of a SHG crystal, which converts the wavelength to 530 nm. However, the wavelength conversion efficiency of a SHG crystal, such as an MgO-doped lithium niobate (PPLN), is strongly dependent on the wavelength matching between the laser diode and the SHG device.

The allowable wavelength width of a PPLN SHG device is very small—for a typical PPLN SHG device, the full width half maximum (FWHM) wavelength conversion bandwidth is only 0.16 nm, which translates to a temperature change of about 2.7° C. Once the input wavelength deviates from the characteristic phase-matching wavelength of the SHG, the output power at the target wavelength drops drastically. The present inventors have recognized that a number of operating parameters adversely affect wavelength matching in these types of laser devices. For example, the wavelength of a DBR laser changes when the driving current on the gain section is varied. Further, operating temperature changes have differing affects on the phase-matching wavelength of the SHG and the laser wavelength. Accordingly, it is difficult to fabricate a package where the laser diode and the SHG crystal are perfectly wavelength matched.

Given the challenges associated with wavelength matching and stabilization in developing laser sources using second harmonic generation, the present inventors have recognized potential benefits for semiconductor lasers that can be actively tuned in order to achieve optimum output power through proper wavelength matching with SHG crystals and other wavelength conversion devices. For example, the present inventors have recognized that short wavelength devices can be modulated at high speeds without excessive noise while maintaining a non-fluctuating second harmonic output power if the wavelength of the semiconductor is maintained at a stable value during operation. The present inventors have also recognized that wavelength matching and stabilization are significant challenges in developing laser sources in general, without regard to whether second harmonic generation is utilized in the laser source. Accordingly, this invention disclosure relates to micro-heater designs integrated in semiconductor lasers for tuning and stabilizing the wavelength of the semiconductor laser and for matching to the wavelength of the semiconductor laser to other components within the laser source.

In accordance with one embodiment of the present invention, a semiconductor laser is provided comprising a semiconductor substrate, an active region, a ridge waveguide, a driving electrode structure, and a micro-heating element structure. The micro-heating element structure comprises a pair of heating element strips extending along the longitudinal dimension of the semiconductor laser. The heating element strips are on opposite sides of the ridge waveguide such that one of the heating element strips extends along one side of the ridge waveguide while a remaining heating element strip extends along another side of the ridge waveguide.

In accordance with another embodiment of the present invention, the micro-heating element structure comprises at least one heating element strip extending along the longitudinal dimension of the semiconductor laser over the ridge waveguide.

In accordance with yet another embodiment of the present invention, a semiconductor laser according to the present invention is optically coupled to a light wavelength conversion device such as a second harmonic generation (SHG) crystal. A controller may be provided to drive the micro-heating element structure such that an output wavelength of the semiconductor laser substantially matches a characteristic phase-matching wavelength of the light wavelength conversion device.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
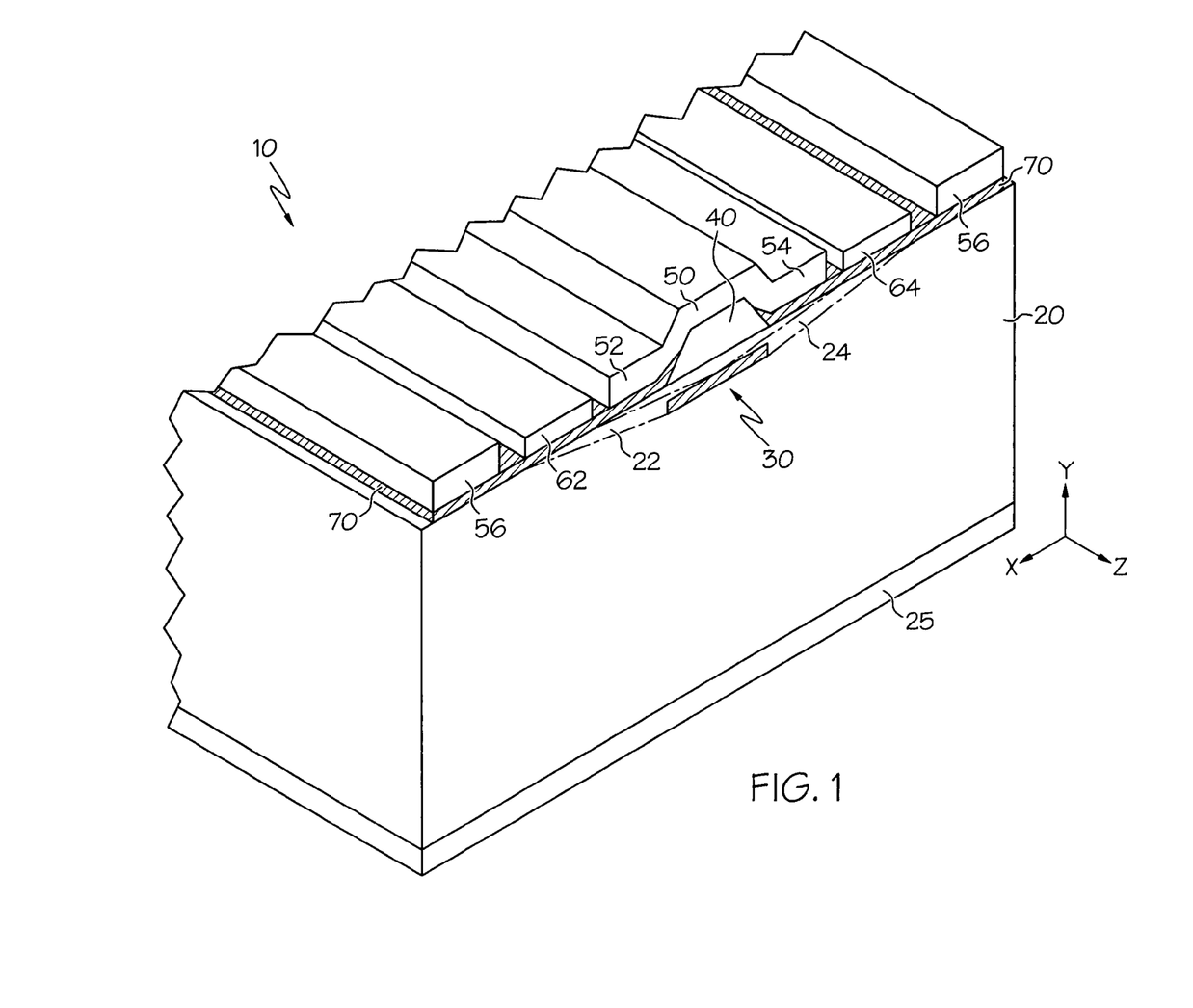
FIG. 1 is a cross-sectional schematic illustration of a semiconductor laser incorporating a micro-heating element structure according to one embodiment of the present invention.

Referring to FIG. 1, it is noted that a semiconductor laser 10 according to the present invention may preferably comprise a semiconductor substrate 20 including an active region 30, a ridge waveguide 40, a driving electrode structure, and a micro-heating element structure. In the illustrated embodiment, the driving electrode structure comprises a driving electrode element 50 and the micro-heating element structure comprises a pair of heating element strips 62, 64. The active region 30 is defined by P and N type semiconductor material within the semiconductor substrate 20 and is configured for stimulated emission of photons under an electrical bias $V_{BIAS}$ generated by the driving electrode element 50 and a corresponding N-Type region 25 defined in the substrate 20. The wavelength output of the semiconductor laser 10 is dependent upon the temperature of the ridge waveguide 40 and the active region 30 and the micro-heating element structure is configured to alter the temperature of the ridge waveguide 40 and the active region 30 to tune the wavelength output.

The ridge waveguide 40, which may comprise a raised or buried ridge structure, is positioned to optically guide the stimulated emission of photons along a longitudinal dimension Z of the semiconductor laser 10. For the purposes of defining and describing the present invention, it is noted that the specific structure of the various types of semiconductor lasers in which the concepts of the present invention can be incorporated is taught in readily available technical literature relating to the design and fabrication of semiconductor lasers. For example, and not by way of limitation, the semiconductor laser 10 may comprise a laser diode defining a distributed feedback (DFB) configuration or a distributed Bragg reflector (DBR) configuration.

The heating element strips 62, 64 of the micro-heating element structure extend along the longitudinal dimension Z of the semiconductor laser 10 are fabricated from a material designed to generate heat with the flow of electrical current along a path extending generally parallel to the longitudinal dimension of the ridge waveguide, i.e., along the length of the strips 62, 64. For example, and not by way of limitation, it is contemplated that Pt, Ti, Cr, Au, W, Ag, and Al, taken individually or in various combinations, will be suitable for formation of the strips 62, 64. For example, it may be preferable to utilize an alloy comprising Ti and Pt to form the heating element strips 62, 64.

As is illustrated in FIG. 1, the heating element strips 62, 64 are laterally positioned on opposite sides of the ridge waveguide 40 such that one of the heating element strips 62 extends along one side of the ridge waveguide 40 while the other heating element strip 64 extends along the other side of the ridge waveguide 40. Further, the driving electrode element 50 may also extend laterally on opposite sides of the ridge waveguide 40. The driving current to the heating element strips 62, 64 can be controlled to change the heat generated thereby and thus tune or lock the wavelength of the semiconductor laser.

As is further illustrated in FIG. 1, where lateral portions 52, 54 of the driving electrode element 50 extend laterally on opposite sides of the ridge waveguide 40, the driving electrode structure and the micro-heating element structure may preferably be arranged such that the lateral portion 52 of the driving electrode element 50 and the corresponding heating element strip 62 extend along the same side of the ridge waveguide 40, occupying respective portions of a common fabrication layer on the same side of the ridge waveguide 40. Similarly, the lateral portion 54 of the driving electrode element 50 and the corresponding heating element strip 64 extend along the other side of the ridge waveguide 40, occupying respective portions of a common fabrication layer on the other side of the ridge waveguide 40. As used herein a "common fabrication layer" is a layer of a semiconductor device that comprises one or more components positioned such that they may be fabricated in a common fabrication step. The identification of components herein as being in a common fabrication layer should not be interpreted to require that they be fabricated in a common plane. For example, referring to FIG. 1, the driving electrode element 50 and the heating element strips 62, 64 are not entirely coplanar but may be formed in a common fabrication step. Accordingly, they may be said to lie in a common fabrication layer. In contrast, the driving electrodes element 50 and the active region 30 cannot be said to lie in a common fabrication layer because the nature of the materials forming these components and the location of the components do not lend themselves to fabrication in a common step.

Figure 2A:
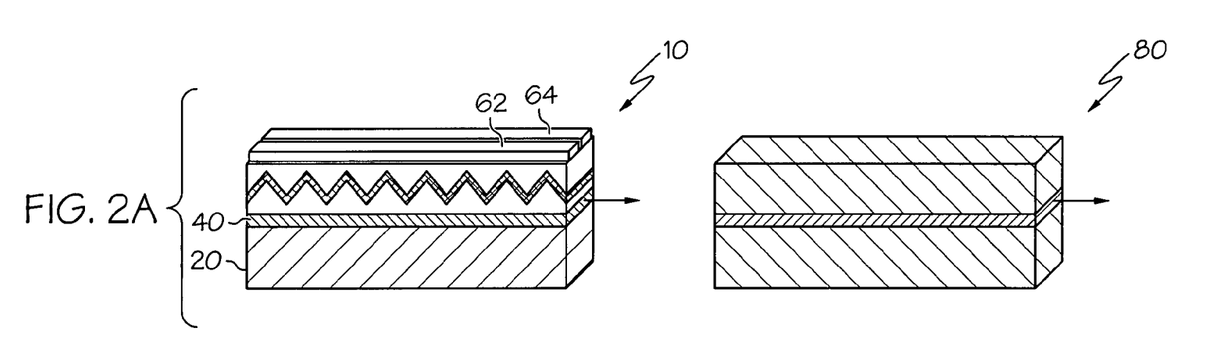
FIG. 2A is a schematic illustration of a DFB or similar type semiconductor laser optically coupled to a light wavelength conversion device and including micro-heating element structure according to the present invention.
Figure 2B:
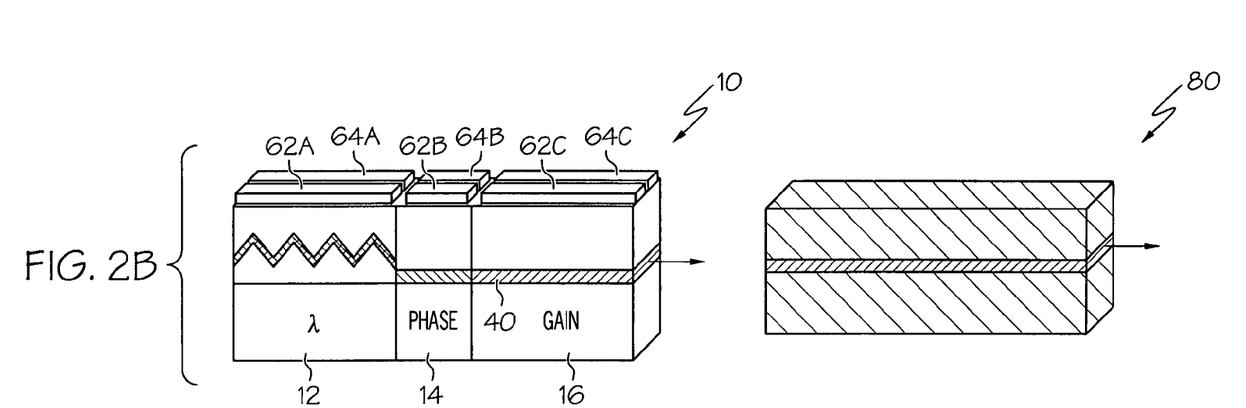
FIG. 2B is a schematic illustration of a DBR or similar type semiconductor laser optically coupled to a light wavelength conversion device and including micro-heating element structure according to the present invention.

The present inventors have recognized that semiconductor laser tuning and stabilization can be achieved by utilizing thin-film micro-heater designs of the type illustrated in FIG. 1, where heating element strips 62, 64 are provided on both sides of the ridge waveguide 40 and are integrated with the driving electrode structure. Specifically, according to the design of the present invention, the location of the heating element strips 62, 64 can be optimized by allowing for the integration of the heating element strips 62, 64 with the driving electrode structure in a common fabrication layer, on a common side of the ridge waveguide 40. Although the present invention is illustrated in FIGS. 1 and 2 with driving electrode element 50 and corresponding heating element strips 62, 64 extending along both sides of the ridge waveguide 40, it is contemplated that driving electrode element 50 need not include the lateral portions 52, 54 or be provided on both sides of the ridge waveguide 40.

Also illustrated in FIG. 1 are respective direct heating paths 22, 24 that extend from the heating element strips 62, 64 of the micro-heating element structure, through the semiconductor substrate 20, to the active region 30. According to the illustrated embodiment of the present invention, the heating element strips 62, 64 are positioned such that the driving electrode structure does not interfere substantially with the direct heating paths 22, 24. "Substantial" interference with the direct heating paths can be quantified by referring to the amount of heat "sinked" by portions of the driving electrode structure interfering with the direct heating paths 22, 24. For example, it is contemplated that any interference that would reduce the amount of heat reaching the active region 30 by greater than about 10% to about 25% would be "substantial" interference with the direct heating path. In some contemplated preferred embodiments, the degree of interference corresponds to a reduction in directed heat of less than about 5%. In further contemplated embodiments, the heating element strips 62, 64 are positioned such that the driving electrode structure completely avoids interference with the direct heating paths 22, 24. In all of these embodiments, any heat sinking effect attributable to the driving electrode structure can be minimized, or at least reduced to a significant extent.

The micro-heating element structure should be positioned close enough to the active region 30 to ensure that heat generated by the heating element strips 62, 64 reaches the active region 30 area quickly, e.g., in about 4 microseconds or less. For example, and not by way of limitation, the heating element strips 62, 64 of the micro-heating element structure could be positioned such that they are displaced from the PN junction of the active region 30 by less than about 5 μm. It is contemplated that the spacing between the heating element strips 62, 64 and the active region 30 could be significantly less than 5 μm, e.g., about 2 μm, if the fabrication processes for forming the strips 62, 64 and the driving electrode structure are sufficiently precise.

Care should be taken to ensure that the operation of the driving electrode structure is not inhibited by the electrically conductive elements of the micro-heating element structure. For example, to this end, it may be preferable to ensure that the heating element strips 62, 64 of the micro-heating element structure are displaced from the driving electrode element 50 by at least about 2 μm. As is illustrated in FIG. 1, the resistive thin film forming the heating element strips 62, 64 and the various electrically conductive layers forming the driving electrode structure and the micro-heating element structure may be formed on an electrically insulating thin film 70 deposited directly on the semiconductor substrate 20. It is additionally noted that a thin protective coating may be formed over heating element strips 62, 64.

Figure 3:
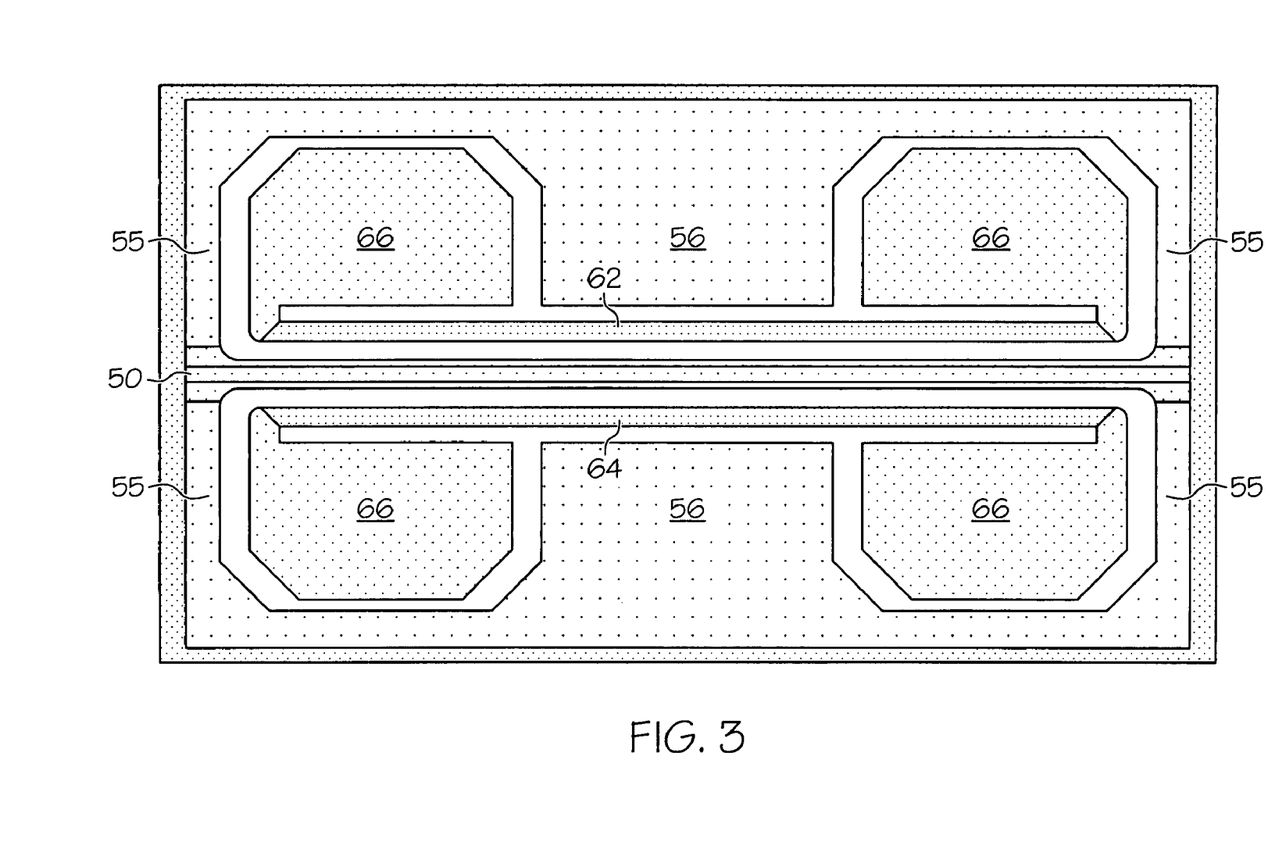
FIG. 3 is a plan view, schematic illustration of an electrode layer including a driving electrode structure and a micro-heating element structure according to the present invention.

Referring to FIG. 3, the driving electrode structure may preferably comprise anode electrode regions 56 and the P-type metal of the driving electrode element 50 formed over and around the ridge waveguide 40 for current injection and heat distribution. The anode metal is connected to the P-type metal of the driving electrode element 50 through electrically conductive traces 55 formed around the heating element strips 62, 64 and the heating element contact pads 66. The heating element strips 62, 64 are located on both sides of the ridge 40, several micrometers to tens of micrometers away from the PN junction of the active region 30. There is a gap of several micrometers between the heating element strips 62, 64 and the P-type metal for electrical insulation. There is also a gap between the heating element strips 62, 64 and the anode electrode regions 56 and heating element contact pads 66. This gap width may be tailored so that the heat generated by the heating element strips 62, 64 would not be substantially dissipated through the anode electrode regions 56. As is noted above, it is contemplated that the aforementioned gap width may preferably be at least ten micrometers. It is contemplated that "substantial" dissipation of the heat generated by the heating element strips can be quantified by referring to the amount of heat "sinked" by portions of the anode electrode regions 56 and heating element contact pads 66. For example, it is contemplated that any dissipation by these elements that would reduce the amount of heat reaching the active region 30 by greater than about 10% to about 25% would be "substantial." In some contemplated preferred embodiments, the degree of dissipation corresponds to a reduction in directed heat of less than about 5%.

An additional embodiment of the present invention is illustrated with reference to FIG. 2A, where the micro-heating element structure illustrated in FIG. 1 is incorporated in a DFB semiconductor laser 10 coupled to a light wavelength conversion device 80, such as a second-harmonic-generation (SHG) crystal. For clarity of illustration, the relative size of the heating element strips 62 and 64 has been exaggerated and the ridge waveguide 40 has been illustrated schematically without regard to its actual position within the laser 10. FIG. 1 and the accompanying text provide a better description of the configuration of the waveguide 40. In addition, the DFB semiconductor laser 10 and the light wavelength conversion device 80 are merely illustrated symbolically. As will be appreciated by those familiar with DFB laser design, the DFB semiconductor laser comprises a distributed feedback grating that extends generally along the direction of the ridge waveguide incorporated within the laser 10. Driving electrodes, not shown in FIG. 2A but discussed above with reference to FIG. 1, are incorporated in the device to generate the forward bias necessary for operation of the laser. The heating element strips 62, 64 extend along at least a portion of the distributed feedback grating, on opposite sides of the waveguide ridge of the laser 10. As is noted above, the heating element strips 62, 64 can be used to control the temperature of the active region in the vicinity of the grating to actively tune the DFB laser 10 in order to achieve optimum output power through proper wavelength matching with the SHG crystal 80 or other wavelength conversion device.

FIG. 2B illustrates the concepts of the present invention in the context of a DBR laser 10 comprising a wavelength selective region 12, a phase matching region 14, and a gain region 16. As is noted above with respect to the DFB laser 10 of FIG. 2A, the DBR laser 10 and the accompanying light wavelength conversion device 80 are merely illustrated symbolically in FIG. 2B. The wavelength selective region 12 typically comprises a first or second order Bragg grating that is positioned outside the active region of the cavity. This section provides wavelength selection, as the grating acts as a mirror and reflects only a single wavelength back into the laser cavity. The gain region 16 of the DBR laser 10 provides the major optical gain of the laser and the phase matching region 14 creates an adjustable optical phase shift. As will be appreciated by those familiar with DBR lasers, the wavelength selective region 12 may be provided in a number of suitable alternative configurations that may or may not employ a Bragg grating. The ridge waveguide 40, illustrated in FIG. 1, extends through the wavelength selective region 12, the phase matching region 14, and the gain region 16.

In the embodiment of FIG. 2B, the micro-heating element structure may comprise heating element strips 62A, 64A incorporated in the wavelength selective region 12, heating element strips 62B, 64B incorporated in the phase matching region 14, heating element strips 62C, 64C incorporated in the gain region 16, or combinations thereof. For example, according to one embodiment of the present invention, the heating element strips 62A, 64A, 62B, 64B are configured to extend along the longitudinal dimension of the ridge waveguide 40 in the wavelength selective region 12 and the phase matching region 14 but do not extend a substantial distance in the gain region 16. This type of configuration has operational advantages in contexts where thermal control of the wavelength selective region 12 and the phase matching region 14 is desired. For example, the wavelength of a DBR laser can be tuned through mode hops by varying the temperature at the grating location in the wavelength selective region 12. Similarly, the temperature of the phase matching region 14 of a DBR laser can be adjusted to tune the wavelength of the DBR laser by changing the optical path length of the phase matching region 14.

The present invention contemplates thermal tuning by varying the temperatures of the wavelength selective region 12 or the phase matching region 14. The present invention also contemplates thermal tuning by varying the temperatures of the wavelength selective region 12 and the phase matching region 14—a feature of the present invention that enables continuous wavelength tuning without mode hops. Additionally, the present invention contemplates that the integrated micro-heaters described herein can be fabricated on any of the regions 12, 14, 16 for additional functionalities, such as removing mode hopping by phase thermal compensation and/or gain thermal compensation, achieving wavelength stability during gain current modulation. Accordingly, the present invention contemplates that temperature control of the gain region 16 may be preferred in some circumstances, either alone or in combination with temperature control in the wavelength selective region 12 and the phase matching region 14. In cases where temperature control in multiple regions is preferred, the heating element strips and the associated micro-heating element structure are configured to enable independent control of heating in each region.

Figure 5:
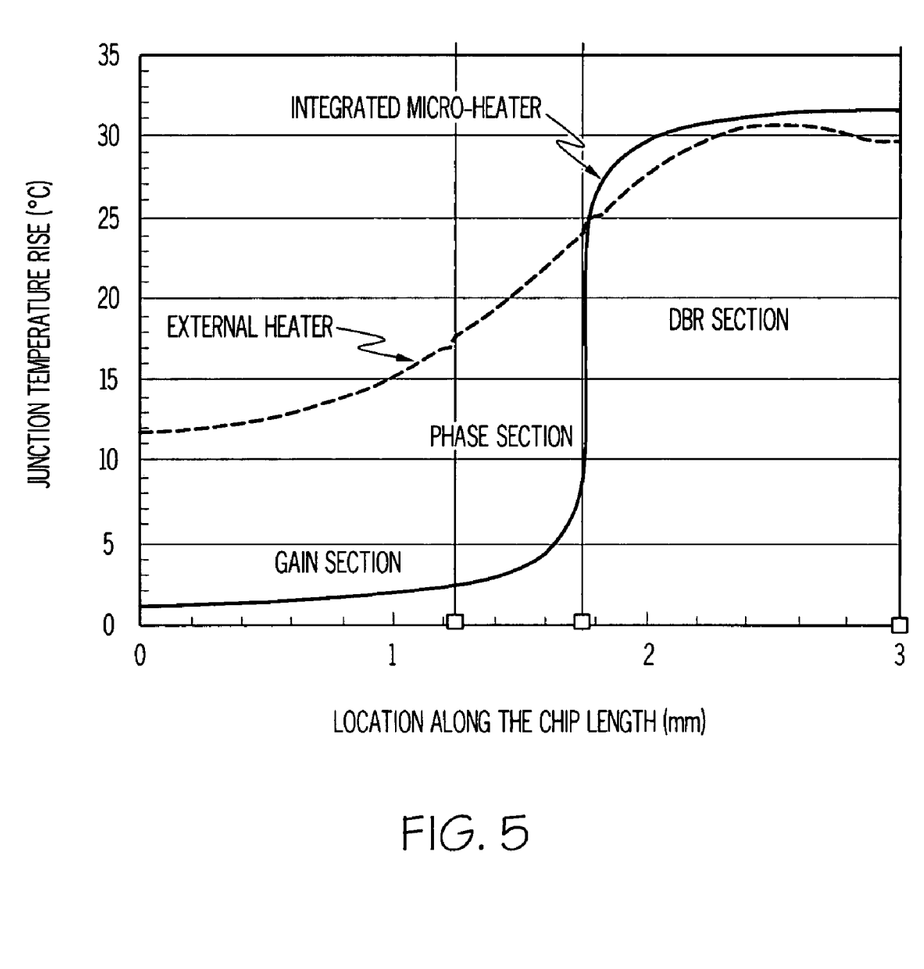
FIG. 5 is a graph illustrating the manner in which junction temperature varies along the length of a semiconductor laser chip according to the present invention.

When the temperature of the wavelength selective region 12 or the phase matching region 14 is tuned, it is typically desirable to have minimum increases in temperature in the gain region 16 because temperature rises therein can negatively impact the output power and reliability of the laser 10. FIG. 5 illustrates the manner in which the present invention isolates a temperature increase in the DBR section of a DBR laser from the gain region of the laser. Specifically, FIG. 5 presents a comparison of two junction temperature rise profiles along the length of the laser of a DBR laser assembly. The first profile, represented by a dashed line, is a representative profile with temperature tuning of the DBR section using an external heater. The second profile, represented by the solid line in FIG. 5, is a representative profile with temperature tuning of the DBR section using the integrated micro-heaters of the present invention in the DBR section. In this example, only the DBR section temperature was thermally tuned. The total power of the integrated micro-heaters was 1 W. To achieve the similar DBR temperature tuning range, the power of the external heater was 5 W. The gain and phase matching region temperatures have much smaller increases in the case where the integrated micro-heaters of the present invention are utilized, as is compared to the case where the external heater is utilized. For example, according to one embodiment of the present invention where integrated micro heaters are utilized, the gain temperature only increases 5-7% of the DBR temperature rise and the phase temperature only increases 10-16% percent of the DBR temperature rise. In contrast, where an external heater is utilized, the gain and phase temperatures increase 42% and 68% of the DBR temperature rise, respectively.

FIG. 5 should not be taken as a precise representation of the temperature profile in the context of an external heater because particular external heater structures are beyond the scope of the present invention and vary significantly from one embodiment to the next. Further, FIG. 5 should only be taken as an approximation of a typical temperature profile according to one or more contemplated embodiments of the present invention and should not be interpreted as a limitation on the scope of all embodiments of the present invention. As is illustrated in FIG. 5, the heating element strips are positioned such that the profile has a positive, substantially vertical slope as it transitions from the phase matching region to the wavelength selective region. In executing the concepts of the present invention, the average temperature increase attributable to heat generated by the heating element strips in a target laser region, e.g., the wavelength selective region, is at least three times that which is attributable to heat generated by the heating element strips in an adjacent laser region, i.e., the phase matching region or the gain region.

Figure 4:
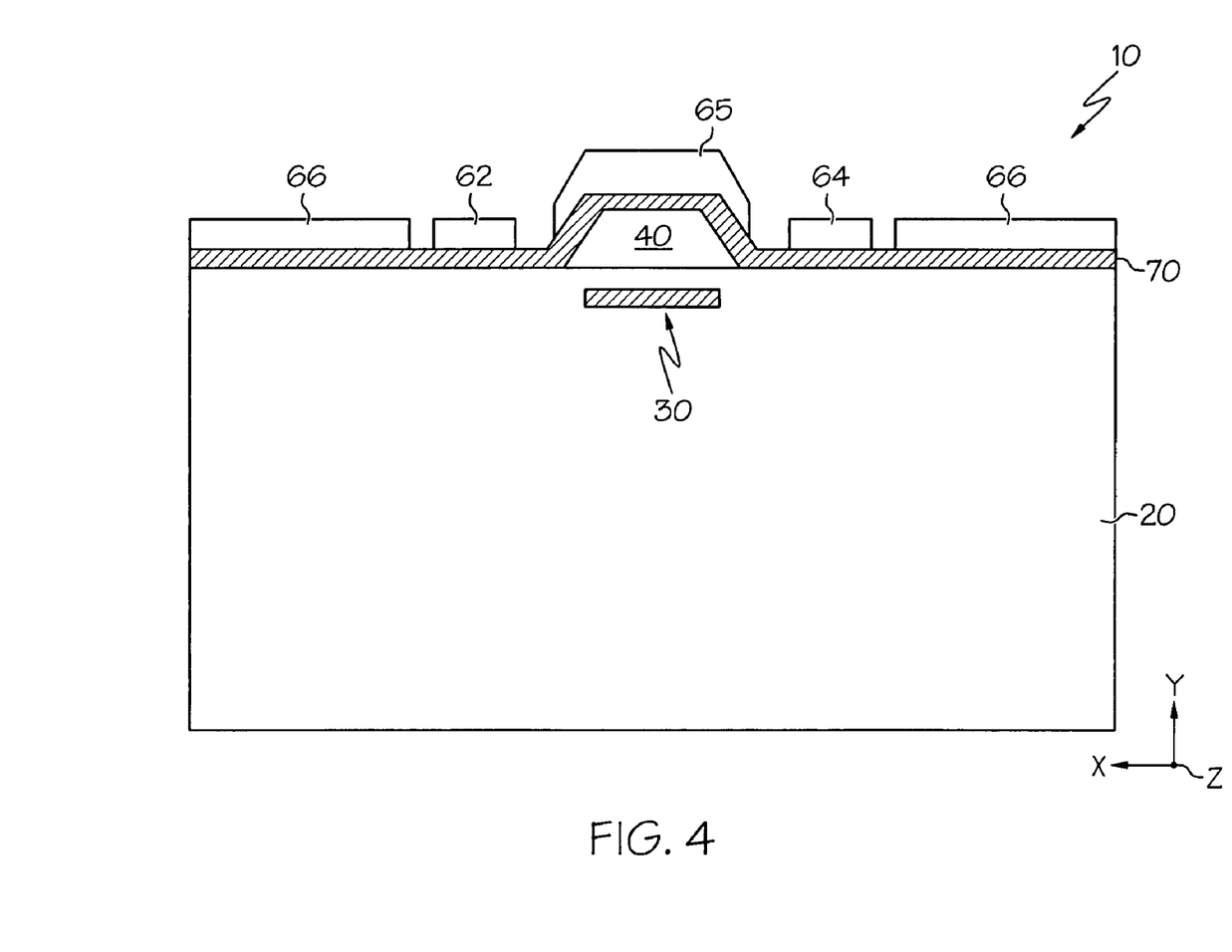
FIG. 4 is a schematic illustration of a semiconductor laser incorporating a micro-heating element structure according to another embodiment of the present invention.

Referring to FIG. 4, according to another embodiment of the present invention, the micro-heating element structure comprises a heating element strip 65 that extends along the longitudinal dimension Z of the semiconductor laser 10 over the ridge waveguide 40. In the context of a DBR-type laser, a heating element strip 65 of the type illustrated in FIG. 4 can be used to effectively heat either the wavelength selective region 12 or the phase matching region 14 of a DBR-type laser (see FIG. 2B) because these regions can be fabricated to exclude electrically conductive elements of the driving electrode structure. As is illustrated in FIG. 4, an additional pair of heating element strips 62, 64 and associated heating element contact pads 66 may be provided alongside the ridge waveguide 40 to give additional temperature control of the waveguide 40.

As is illustrated in FIG. 4, the intervening space extending along the longitudinal dimension Z of the semiconductor laser 10 between the heating element strip 65 and the ridge waveguide 40 does not include any electrically conductive elements from the driving electrode structure. As a result, a direct heating path unencumbered by electrically conductive elements that could sink heat from the system can be established between the active region 30 and the heating element strip 65. It is contemplated that the width of the heating element strip 65 may preferably be at least as large as the width of the active region 30 but less than about four times the width of the active region 30.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents. For example, although the present description illustrates the concepts of the present invention in the context of a raised ridge waveguide, it is contemplated that the present invention will also have utility in the context of a "buried" ridge waveguide structure. Accordingly, the recitation of a "ridge waveguide" in the appended claims includes raised and buried ridge waveguides and should not be taken as limited to raised ridge waveguide structures.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

What is claimed is:

1. A semiconductor laser comprising a semiconductor substrate, an active region, a ridge waveguide, a driving electrode structure, and a micro-heating element structure, wherein:

said driving electrode structure is positioned over said semiconductor substrate and over said ridge waveguide;

said active region is defined within said semiconductor substrate and is configured for stimulated emission of photons under an electrical bias generated by said driving electrode structure;

said ridge waveguide is positioned over said semiconductor substrate to optically guide said stimulated emission of photons along a longitudinal dimension of said semiconductor laser;

said micro-heating element structure is positioned over said semiconductor substrate and comprises a pair of thin film heating element strips extending from one terminal end portion of sad strip to another along said longitudinal dimension of said semiconductor laser on opposite sides of said ridge waveguide and on opposite sides of portions of said driving electrode structure;

said thin film heating element strips and at least a portion of said driving electrode structure occupy respective portions of a common fabrication layer on common sides of said ridge waveguide; and said driving electrode structure further comprises electrically conductive traces in said common fabrication layer, said electrically conductive traces extending from portions of said driving electrode structure interposed between said thin film heating element strips around said terminal end portions of said thin film heating element strips.

2. A semiconductor laser as claimed in claim 1 wherein:
a wavelength output of said semiconductor laser is dependent upon a temperature of said active region; and
said micro-heating element structure is configured to alter a temperature of said active region to an extent sufficient to enable tuning of said wavelength output.

3. A semiconductor laser as claimed in claim 2 wherein said micro-heating element structure is configured such that heat generated by said heating element strips reaches said active area in about 4 microseconds or less.

4. A semiconductor laser as claimed in claim 1 wherein said heating element strips of said micro-heating element structure are displaced from electrically conductive elements of said driving electrode structure by at least about 2 μm.

5. A semiconductor laser as claimed in claim 1 wherein said heating element strips of said micro-heating element structure are fabricated from Pt, Ti, Cr, Au, W, Ag, and Al, taken individually or in various combinations.

6. A semiconductor laser as claimed in claim 1 wherein:
said micro-heating element structure is positioned such that a direct heating path is provided between said micro-heating element structure and said active region; and
said direct heating path is free of substantial interference from driving electrode structure.

7. A semiconductor laser as claimed in claim 1 wherein:
said micro-heating element structure is positioned such that a direct heating path is defined between said micro-heating element structure and said active region; and
said direct heating path is substantially confined within said semiconductor substrate.

8. A semiconductor laser as claimed in claim 1 wherein:
said semiconductor laser comprises a DBR laser comprising a wavelength selective region, a phase matching region, and a gain region extending generally along a direction of said ridge waveguide; and
said heating element strips of said micro-heating element structure extend along at least a portion of at least one of said wavelength selective, phase, and gain regions.

9. A semiconductor laser as claimed in claim 8 wherein said heating element strips are positioned such that the junction temperature of said laser increases along a positive, substantially vertical slope over a transition from one of said regions not including said heating element strips to one of said regions including said heating element strips.

10. A semiconductor laser as claimed in claim 1 wherein:
said semiconductor laser comprises a DBR laser comprising a wavelength selective region, a phase matching region, and a gain region extending generally along a direction of said ridge waveguide; and
said heating element strips of said micro-heating element structure extend along said wavelength selective region, said phase matching region, and said gain region.

11. A semiconductor laser as claimed in claim 1 wherein:
said semiconductor laser comprises a DBR laser comprising a wavelength selective region, a phase-matching region, and a gain region extending generally along a direction of said ridge waveguide; and
said heating element strips of said micro-heating element structure extend along at least one of said wavelength selective and said phase matching regions but do not extend a substantial distance in said gain region.

12. A semiconductor laser as claimed in claim 1 wherein:
said semiconductor laser is configured to define a wavelength selective region, a phase-matching region, and a gain region;
said ridge waveguide is positioned within said wavelength selective region, said phase-matching region, and said gain region;
said heating element strips of said micro-heating element structure extend along said ridge waveguide in at least two of said wavelength selective region, said phase-matching region, and said gain region; and
said heating element strips are configured to enable independent control of heating in regions in which they extend.

13. A semiconductor laser as claimed in claim 1 wherein:
said semiconductor laser is configured as a DFB laser comprising a distributed feedback grating extending generally along a direction of said ridge waveguide; and
said heating element strips of said micro-heating element structure extend along at least a portion of said distributed feedback grating.

14. A device comprising a semiconductor laser as claimed in claim 1 and a light wavelength conversion device optically coupled to said semiconductor laser.

15. A semiconductor laser as claimed in claim 14 wherein said light wavelength conversion device comprises a second harmonic generation (SHG) crystal.

16. A semiconductor laser as claimed in claim 14 wherein said device further comprises a controller configured to drive said micro-heating element structure such that an output wavelength of said semiconductor laser substantially matches a characteristic phase-matching wavelength of said light wavelength conversion device.

17. A semiconductor laser as claimed in claim 1 wherein:
said micro-heating element structure further comprises heating element contact pads; and
said electrically conductive traces extend in said common fabrication layer around said terminal end portions of said thin film heating element strips and said heating element contact pads.

18. A semiconductor laser as claimed in claim 1 wherein:
said micro-heating element structure further comprises heating element contact pads, each of which is coupled to one of said terminal end portions of the thin film heating element strips; and
longitudinally extending gaps are provided between portions of said heating element contact pads and said thin film heating element strips to limit heat dissipation from said thin film heating element strips through said heating element contact pads.

* * * * *